United States Patent [19]

Betz

[11] Patent Number: 4,824,378
[45] Date of Patent: Apr. 25, 1989

[54] SYSTEM FOR THE PROGRAMMING OF A MEASURING INSTRUMENT INSTALLED IN AN AUTOMOTIVE VEHICLE

[75] Inventor: Egon Betz, Kronberg, Fed. Rep. of Germany

[73] Assignee: VDO Adolf Schindling AG, Frankfurt am Main, Fed. Rep. of Germany

[21] Appl. No.: 82,823

[22] Filed: Aug. 5, 1987

[30] Foreign Application Priority Data

Sep. 17, 1986 [DE] Fed. Rep. of Germany ....... 3631549

[51] Int. Cl.⁴ .............................................. H05K 1/00
[52] U.S. Cl. ................................... 439/55; 324/158 P; 439/824; 439/296
[58] Field of Search ...................... 439/55, 75, 76, 915, 439/935, 933, 893, 824, 296; 33/504, 505; 73/301, 313; 324/158 F, 158 P

[56] References Cited

U.S. PATENT DOCUMENTS 4,054,353 10/1977 Saunders et al. ..................... 439/76
4,135,226 1/1979 Kourimsky ............................ 439/76
4,355,853 10/1982 Kourimsky ............................ 439/76
4,702,708 10/1987 Reuss et al. ............................ 439/76
4,723,196 2/1988 Hofmeister et al. ................... 439/76

Primary Examiner—David Pirlot
Attorney, Agent, or Firm—Martin A. Farber

[57] ABSTRACT

In a system for the programming of a measuring instrument which is installed in an automotive vehicle and has a front plate and a cover glass and within which an electric circuit is arranged, openings which are aligned with each other are provided in the front plate and the cover glass. Within the region of the opening there are provided in the front plate contacts which are connected with the electric circuit. The contacts can be formed of conductive paths of a circuit board which is arranged parallel to the front plate. A plug which can be introduced into the openings has axially resilient contact tips, at the end of the plug facing the circuit board, and it is provided with a device for locking the plug within the opening in the cover glass.

12 Claims, 2 Drawing Sheets

SYSTEM FOR THE PROGRAMMING OF A MEASURING INSTRUMENT INSTALLED IN AN AUTOMOTIVE VEHICLE

FIELD AND BACKGROUND OF THE INVENTION

The present invention relates to a system for the programming of a measuring instrument which is installed in an automotive vehicle and has a front plate and a cover glass and within which an electric circuit is arranged.

Measuring instruments for automotive vehicles are frequently adapted (programmed) to the specific circumstances of the type of vehicle in question. This is effected, for instance, in the manner that special characteristic curves are stored in a memory which is present in the measuring instrument. This is done in particular in the case of instruments for indicating fuel consumption.

Frequently, however, the required data are not known before the installation in the vehicle.

SUMMARY OF THE INVENTION

It is an object of the present invention to make possible the programming of a measuring instrument after it has been installed in a vehicle with as little additional expense as possible, particularly in the case of measuring instruments which are manufactured in large quantities.

According to the invention, openings aligned with each other are provided in the front plate (1) and the cover glass (3) and contacts (4, 39) which are connected with the electric circuit are arranged in the region of the opening (7) in the front plate (1).

By a further development of the invention which consists of the fact that a cylindrical guide (6) is formed on the cover glass (3), simple introduction of a programming plug is made possible.

Another feature of the invention consists therein that the opening (7) in the front plate (1) is provided with an anti-turning device (26) for a programming plug (5) which is to be introduced. In this way, a clear association of the contacts of the electric circuit with the contact parts of the programming plug is obtained.

As further advantageous feature of the invention the contacts are formed of contact springs (39) which are arranged on the circumference of an imaginary extension of the opening (35) in the front plate (1) and the spring force of which acts perpendicular to the axis of the opening (35).

For this purpose, a plug (36) of substantially cylindrical shape is provided which can be introduced into the openings and in a front portion on the outer surface of which a plurality of longitudinally extending contact pieces are arranged.

With this development of the invention, there results directly, without further measures, a sufficiently large contact pressure between the contact springs and the contact pieces in the plug. The force of adherence between the contact springs and the contact pieces of the plug will also, in general, be sufficient to prevent the program plug being pulled out by mistake during the programming. However, a few additional parts are necessary in the measuring instrument, which is a mass-produced article.

In another advantageous embodiment of the invention, the contacts (4) are formed of conductive paths on a circuit board (2) arranged parallel to the front plate (1).

For this purpose, a substantially cylindrically shaped plug (5) which can be introduced into the openings is provided, it having axially resilient contact tips (8) on the end of the plug facing the circuit board (2). Furthermore, the plug (5) is provided with a device (20) for locking the plug in the opening within the cover glass (3).

In this embodiment no additional parts are required in the measurement instrument. As in the case also of the first embodiment of the invention, there is merely required a closure plug for the openings in order to prevent dust from penetrating into the measuring instrument and/or into the space between the front plate and the cover glass.

The necessary contact pressure can be maintained in advantageous fashion during the programming in the manner that a part of the plug (5) which faces away from the contact tips (8) is developed as a turnable sleeve (19) on the circumference of which there are projections (2) which form a bayonet lock with the cylindrical guide (6).

Another improvement in the contacting is obtained in the manner that each of the resilient contact tips (8) is guided in a sleeve (10) in such a manner that upon the movement in opposition to the spring force they carry out a turning movement.

The penetration of dust into the inside of the measuring instrument as well as into the space between the front plate and the cover glass can be prevented in advantageous fashion in the manner that a closure plug (42) is provided which can be introduced into the cylindrical guide (6, 41) and into the opening in the front plate (1), that the closure plug (42) is provided with a detent device (43) and can only be removed from the cylindrical guide (6, 14) and the opening in the front plate (1) by the use of a tool (45).

BRIEF DESCRIPTION OF THE DRAWINGS

With the above and other objects and advantages in view, the present invention will become more clearly understood in connection with the detailed description of preferred embodiments, when considered with the accompanying drawings, of which:

FIG. 1a is an end view of FIG. 1;

DETAILED DESCRIPTION OF THE PREFERRED EMBODIMENTS

The same parts are provided with the same reference numbers in the figures.

Figure 1:
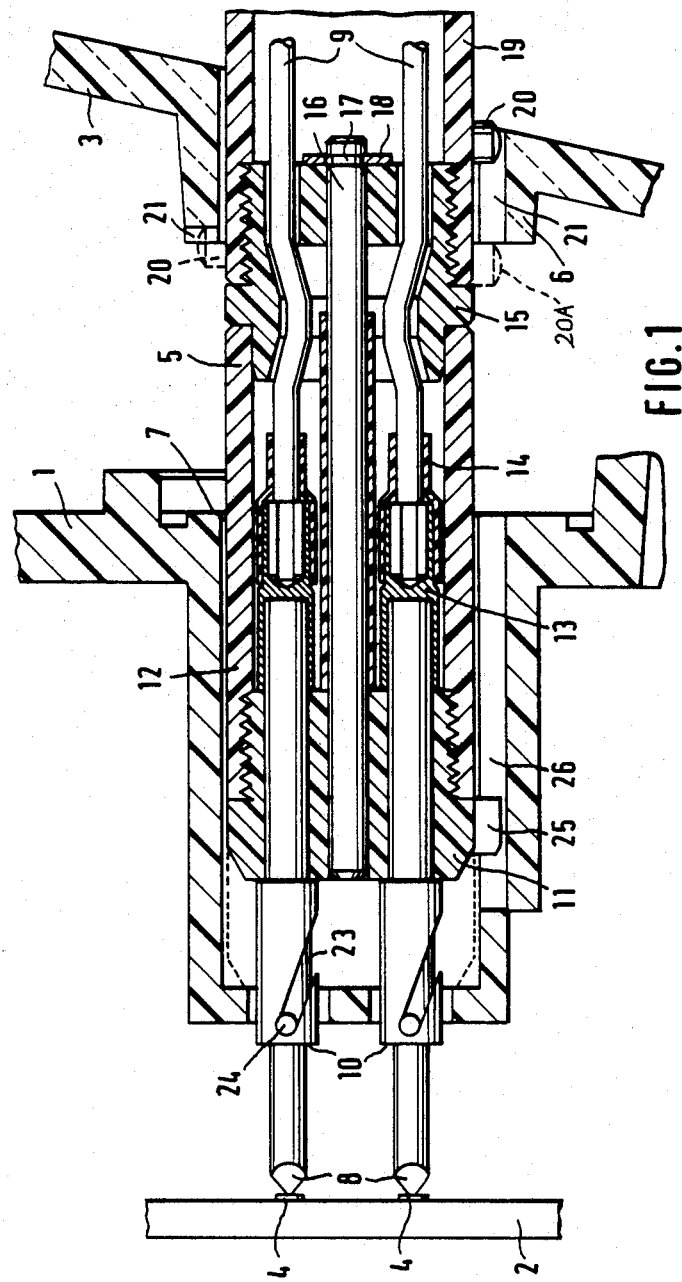
FIG. 1 is an axial sectional view of a first embodiment of the invention.

In the embodiment shown in FIG. 1, only the parts of the measuring instrument which are necessary for an understanding of the invention have been shown. They are a front plate 1 which bears among other things a scale (not shown), a circuit board 2 on which the electric circuit of the measuring instrument is applied, and a cover glass 3 which is curved and inclined in known manner in order to avoid reflections. The cover glass 3, the front plate 1 as well as the other parts of the measuring instrument form a single unit which is inserted into the instrument panel of an automotive vehicle. The conductive paths of the circuit board 2, which moreover are not shown, form, as shown in FIG. 1a, five contacts 4, arranged in a circle which are connected on the circuit board 2 to a suitable circuit.

For the programming, a programming plug 5 is now introduced through an opening in the cover glass which is developed as a cylindrical guide 6 and through an opening 7 in the front plate 1.

As a result of this the contact tips 8 strike against the contacts 4, so that the circuit present on the circuit board 2 is connected via the contact tips 8 and lines 9 to a programming instrument, not shown.

The contact tips 8 are mounted in sleeves 10 and are pressed individually in the direction towards the circuit board 2 by a coil spring, not shown. The sleeves 10 are held by a common holding part 11 which, in its turn, is inserted into a larger sleeve 12 which forms a front part of the housing of the contact plug 5. The rear part of the sleeves 10 serves as connecting device for bushing 13 into which the lines 9 are soldered. For insulation a shrink tube 14 is provided in each case.

Into the rear part of the sleeve 12 there is inserted an intermediate mounting 15 which is turnable with respect to the sleeve 12 and rests on the one side against the end of the sleeve 12 and is centered by the inner surface of the sleeve 12 and, on the other side, is held by a shaft 16 which is anchored in the holding part and has a groove 17 into which a suitable lock ring 18 is inserted.

The turnable intermediate mounting 15 bears a further sleeve 19 which forms the rear part of the housing and is provided on its periphery with at least one projection 20 which, upon introduction into the cylindrical guide part 6, passes through a groove 21. When the programming plug 5 has been introduced sufficiently far, the projection 20 can be brought into a detent position 20A by turning the sleeve 19. In this way the required contact pressure is assured even without additional pressure on the programming plug 5.

For the further improvement of the contacting, helically extending guides 23 into which the projections 24 arranged on the contact tips 8 engage are provided in the sleeves 10. In this way, upon the compressing of the coil springs (not shown) a turning movement of the contact tips 8 is carried out, as a result of which the contact tips 8 pierce through any layer of oxide (rust) which may be present.

The holding part 11 is provided with a projection 25 which engages into a longitudinal groove 26 in the opening 7. As a result, an anti-turning system is produced for the programming plug 5, which can thus only be introduced into the opening 7 in such a manner as to assure a correct association of the contacts 4 on the circuit board 2 with the contact tips 8.

Figure 2:
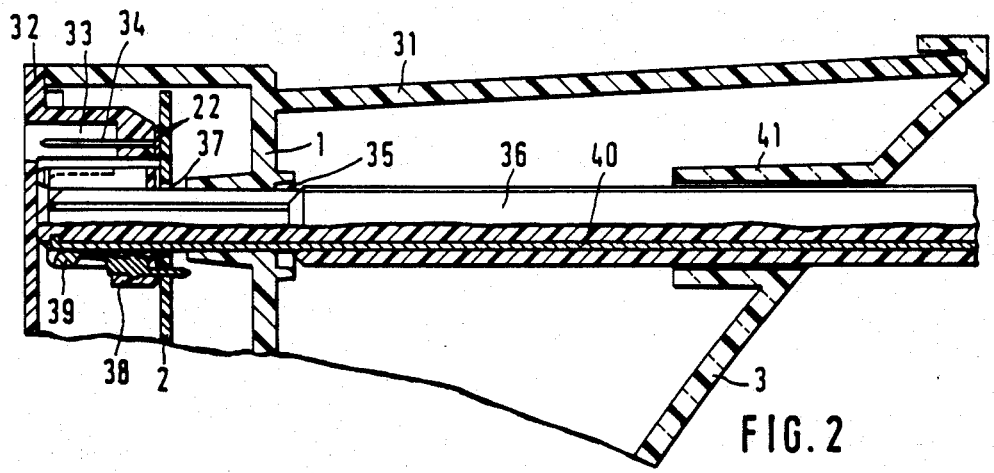
FIG. 2 is a broken-away sectional view of a second embodiment with a program plug inserted.

In the embodiment shown in FIG. 2, aside from the front plate 1, other parts of the measuring instrument are also shown. Integral with the front plate 1 there is a front frame 31 which connects the front plate 1 to the cover glass 3. A base plate 32 closes the measuring instrument off from the rear and has a cutout 33 which is developed as connector device and contains contact inserts 34 which are introduced into the conductor path 22. In the extension of an opening 35 for the receiving of the programming plug 36, an opening 37 is also provided in the conductor path 22. A programming socket 38 which contains five contact springs is arranged on the conductor path 22, aligned with the opening. The contact springs 39 cooperate with electric conductors 40 which lie free in a front region of the programming plug 36 and thus serve as contact pieces.

For the better introduction of the programming plug 36, a cylindrical guide 41 is developed on the cover glass 3.

Figure 3:
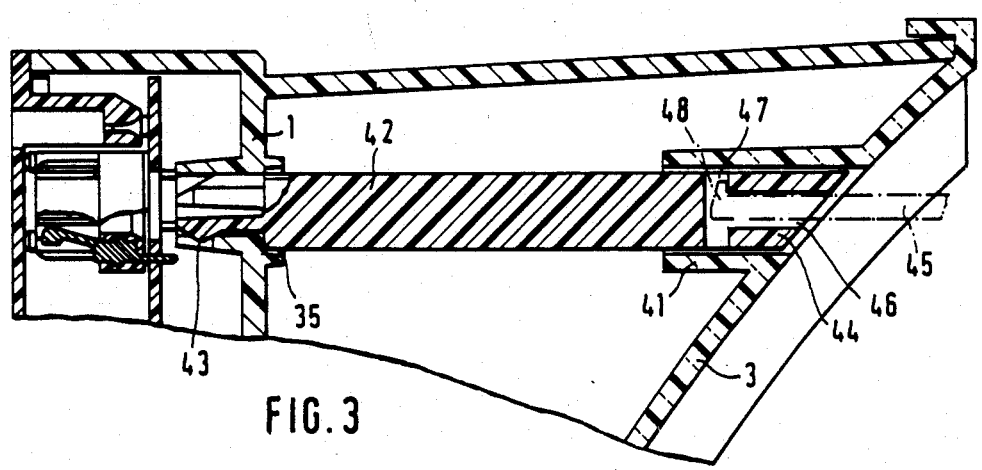
FIG. 3 is a broken-away sectional view of the second embodiment, with a closure plug inserted.

FIG. 3 shows the embodiment of FIG. 2, but in this case, instead of the programming plug 36, a closure plug 42 is introduced into the openings. The closure plug is formed of a single extruded plastic part and is therefore very inexpensive. This is all the more important since the closure plug 42, in contradistinction to the programming plug 36, is supplied with every measuring instrument or automotive vehicle, while the programming plug 36 is required only in small quantities by the automobile manufacturer.

The closure plug is provided with detent springs 43 which engage into corresponding recesses at the opening 35 of the front plate 1. The closure plug closes off both the opening in the cover glass 3 and the opening in the front plate 1 so that no dust penetrates either into the space between cover glass 3 and front plate 1 or into the measuring instrument. The detent springs 43 prevent the closure plug 42 from falling out. Pulling out is also not readily possible since the rear end 44 of the closure plug 42 is fitted to the contour of the cover glass 3. The closure plug 42 can, however, be removed by means of a tool 45, indicated in dashed line. For this purpose, a lengthwise bore 46 as well as a transverse bore 47 are provided in the closure plug. A hook-shaped part 48 of the tool 45 is hooked into the transverse bore 47 in order to pull out the closure plug 42.

Figure 3A:
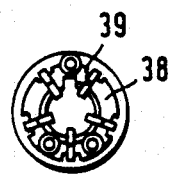
FIGS. 3a and 3b are end views of FIG. 3.
Figure 3B:
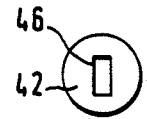

For further explanation, a view of the programming socket 38 together with the contact springs 39 is shown in FIG. 3a.

We claim:

1. In a system for programming a measuring instrument installed in an automotive vehicle and having a front plate and a cover glass and within which an electric circuit is disposed, the improvement wherein
said front plate and said cover glass are formed with openings aligned with each other,
contacts are connected with the electric circuit and are arranged in a region of an opening in the front plate,
an opening in the front plate is provided with an anti-turning device for receipt of a programming plug which is to be introduced.

2. A system according to claim 1, further comprising a cylindrical guide formed on the cover glass.

3. A system according to claim 1, wherein
said contacts are formed of contact springs which are arranged on the circumference of an imaginary extension of an opening in the front plate; and wherein
a spring force of said springs acts perpendicularly to an axis of the front-plate opening.

4. A system according to claim 3, further comprising a plug of substantially cylindrical shape which is introducable into the openings; and
a plurality of longitudinally extending contact pieces which are arranged in a front portion on the outer surface of the plug.

5. A system according to claim 1, wherein
said contacts are formed of conductive paths on a circuit board of said circuit arranged parallel to the front plate.

6. In a system for programming a measuring instrument installed in an automotive vehicle and having a front plate and a cover glass and within which an electric circuit is disposed, the improvement wherein
   said front plate and said cover glass are formed with openings aligned with each other,
   contacts are connected with the electric circuit and are arranged in a region of an opening in the front plate,
   said contacts are formed of conductive paths on a circuit board of said circuit arranged parallel to the front plate,
   a substantially cylindrically shaped plug which is introducable into the openings,
   said plug having axially resilient contact tips on an end of the plug, said end facing the circuit board,
   said plug including means for locking the plug in the opening within the cover glass.

7. A system according to claim 6, further comprising an inner sleeve extending through said front plate; and
   each of the resilient contact tips is guided in said inner sleeve in a turning movement during an axial displacement of said contact tips, said system including spring means exerting a force against said displacement.

8. A system according to claim 6, wherein
   a part of said plug is formed as a turnable sleeve, said part facing away from the contact tips, there being a cylindrical guide extending inward from said cover glass; and
   said plug includes projections forming a bayonet lock with the cylindrical guide, said projections being on the circumference of said turnable sleeve.

9. A system according to claim 8, further comprising an inner sleeve extending through said front plate; and
   each of the resilient contact tips is guided in said inner sleeve in a turning movement during an axial displacement of said contact tips, said system including spring means exerting a force against said displacement.

10. In a system for programming a measuring instrument installed in an automotive vehicle and having a front plate and a cover glass and within which an electric circuit is disposed, the improvement wherein
    said front plate and said cover glass are formed with openings aligned with each other, and
    contacts are connected with the electric circuit and are arranged in a region of an opening in the front plate,
    a cylindrical guide extending inwardly from said cover glass; and
    a closure plug introducable into the cylindrical guide and into an opening in the front plate, said closure plug being provided with a detent device, said plug being removable from the cylindrical guide and the opening in the front plate only by the use of a tool.

11. In a system for programming a measuring instrument installed in an automotive vehicle and having a front plate and a cover glass and within which an electric circuit is disposed, the improvement wherein
    said front plate and said cover glass are formed with openings aligned with each other, and
    contacts are connected with the electric circuit and are arranged in a region of an opening in the front plate,
    a plug introducable into the openings and having contact tips on an end of the plug facing the contacts,
    a part of said plug is formed as a turnable sleeve, said part facing away from the contact tips, there being a cylindrical guide extending inward from said cover glass; and
    said plug includes projections forming a bayonet lock with the cylindrical guide, said projections being on the circumference of said turnable sleeve.

12. A system according to claim 11, further comprising
    an inner sleeve extending through said front plate; and
    each of the resilient contact tips is guided in said inner sleeve in a turning movement during an axial displacement of said contact tips, said system including spring means exerting a force against said displacement.

* * * * *